United States Patent
Tekletsadik et al.

(10) Patent No.: US 7,842,934 B2
(45) Date of Patent: Nov. 30, 2010

(54) TERMINAL STRUCTURES OF AN ION IMPLANTER HAVING INSULATED CONDUCTORS WITH DIELECTRIC FINS

(75) Inventors: Kasegn D. Tekletsadik, Rexford, NY (US); Eric Hermanson, Georgetown, MA (US); Doug May, Melrose, MA (US); Steve Krause, Ipswich, MA (US); Russell John Low, Rowley, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 461 days.

(21) Appl. No.: 11/845,441

(22) Filed: Aug. 27, 2007

(65) Prior Publication Data

US 2009/0057572 A1    Mar. 5, 2009

(51) Int. Cl.
*G21K 5/00* (2006.01)
(52) U.S. Cl. .............. 250/492.21; 250/492.1; 250/492.2; 250/492.22; 250/492.3; 174/110 R; 174/120 R; 174/120 SR; 361/816
(58) Field of Classification Search .......... 250/492.1, 250/492.2, 492.21, 492.22, 492.3, 423 R, 250/424; 174/110 R, 120 R, 120 SR; 361/816
See application file for complete search history.

(56) References Cited

U.S. PATENT DOCUMENTS

| | | | |
|---|---|---|---|
| 4,542,298 A | 9/1985 | Holden | |
| 6,717,079 B2 | 4/2004 | Heller | |
| 6,893,907 B2 | 5/2005 | Maydan et al. | |
| 6,903,350 B1 | 6/2005 | Vanderberg et al. | |
| 2008/0073578 A1* | 3/2008 | Tekletsadik et al. | 250/492.21 |
| 2009/0057573 A1* | 3/2009 | Low et al. | 250/492.21 |

OTHER PUBLICATIONS

U.S. Appl. No. 11/847,139, Low et al.
U.S. Appl. No. 11/841,086, Tekletsadik et al.
U.S. Appl. No. 11/527,842, Tekletsadik et al.
U.S. Appl. No. 11/872,576, Low et al.
U.S. Appl. No. 11/854,852, Lubicki et al.
U.S. Appl. No. 11/968,527, Tekletsadik et al.

* cited by examiner

*Primary Examiner*—David A Vanore
*Assistant Examiner*—Michael Maskell

(57) ABSTRACT

Terminal structures of an ion implanter having insulated conductors with dielectric fins are disclosed. In one particular exemplary embodiment, the terminal structures of an ion implanter may be realized with insulated conductors with one or more dielectric fins. For example, the ion implanter may comprise an ion source configured to provide an ion beam. The ion implanter may also comprise a terminal structure defining a cavity, wherein the ion source may be at least partially disposed within the cavity. The ion implanter may further comprise an insulated conductor having at least one dielectric fin disposed proximate an exterior portion of the terminal structure to modify an electric field.

22 Claims, 8 Drawing Sheets

TERMINAL STRUCTURES OF AN ION IMPLANTER HAVING INSULATED CONDUCTORS WITH DIELECTRIC FINS

FIELD OF THE DISCLOSURE

The present disclosure relates generally to ion implantation and, more particularly, to terminal structures of an ion implanter having insulated conductors with dielectric fins.

BACKGROUND OF THE DISCLOSURE

Ion implantation is a standard technique for introducing impurities into semiconductor wafers. In an ion implantation process, a desired impurity material may be ionized in an ion source, ions from the ion source may be accelerated to form an ion beam of a prescribed energy, and the ion beam may be directed at a front surface of a semiconductor wafer. The energetic ions in the ion beam may penetrate into a bulk portion of the semiconductor wafer and may be embedded into a crystalline lattice of the semiconductor material. The ion beam may be distributed over an area of the semiconductor wafer by beam movement, by wafer movement, or by a combination of beam and wafer movement.

An ion implanter may have a terminal structure. The terminal structure may sometimes be referred to as a "terminal" or "high voltage terminal" and may be fabricated of conductive material such as metal. The terminal structure may have varying geometries that define a cavity and the ion source may be at least partially disposed within the cavity. The terminal structure may be energized to a terminal voltage to assist with acceleration of ions from the ion source. The terminal structure, as well as other components and sub-systems of the ion implanter, are typically surrounded by a grounded enclosure. The grounded enclosure may thus protect personnel from high voltage dangers when the ion implanter is running.

Air has conventionally been used to insulate the terminal structure from the grounded enclosure. However, there may be a constraint on the distance of the air gap between the terminal structure and the grounded enclosure since the size of the grounded enclosure is limited in volume manufacturing of semiconductor wafers. Accordingly, most conventional ion implanters limit the voltage of the terminal structure to about 200 kV.

In view of the foregoing, it may be understood that there are significant problems and shortcomings associated with current terminal structure technologies.

SUMMARY OF THE DISCLOSURE

Terminal structures of an ion implanter having insulated conductors with dielectric fins are disclosed. In one particular exemplary embodiment, the terminal structures of an ion implanter may be realized with insulated conductors with one or more dielectric fins. For example, the ion implanter may comprise an ion source configured to provide an ion beam. The ion implanter may also comprise a terminal structure defining a cavity, wherein the ion source may be at least partially disposed within the cavity. The ion implanter may further comprise an insulated conductor having at least one dielectric fin disposed proximate an exterior portion of the terminal structure to modify an electric field.

In accordance with other aspects of this particular exemplary embodiment, the insulated conductor may be configured to be energized to a first voltage and the terminal structure may be configured to be energized to the first voltage.

In accordance with further aspects of this particular exemplary embodiment, the first voltage may be at least 400 kV.

In accordance with additional aspects of this particular exemplary embodiment, the ion implanter may further comprise a bracket coupled to the terminal structure and the insulated conductor and the bracket may be configured to support the insulated conductor proximate the exterior portion.

In accordance with yet another aspect of this particular exemplary embodiment, the exterior portion of the terminal structure may further comprises a periphery of a top edge of the terminal structure and a periphery of a bottom edge of the terminal structure. Also, the insulated conductor may further comprise a top insulated conductor disposed about the periphery of the top edge and a bottom insulated conductor disposed about the periphery of the bottom edge.

In accordance with still another aspect of this particular exemplary embodiment, the insulated conductor may comprise a grading conductor disposed within an insulator.

In accordance with further aspects of this particular exemplary embodiment, the insulator may comprise a tubular member defining an interior portion, the grading conductor disposed within the interior portion.

In accordance with additional aspects of this particular exemplary embodiment, the insulator may comprise chlorinated polyvinyl chloride (CPVC), polyvinylidene difluoride (PVDF), ethylene chlorotrifluoroethylene (ECTFE), polytetrafluoroethylene (PTFE), or a polyimide.

In accordance with another aspect of this particular exemplary embodiment, the ion implanter may comprise at least one insulated conductors comprising a first dielectric fin and a second dielectric fin disposed proximate the exterior portion of the terminal structure.

In accordance with yet another aspect of this particular exemplary embodiment, the exterior portion of the terminal structure may comprise a first side of the terminal structure and a second side of the terminal structure, and wherein the first dielectric fin may be disposed about the first side of the terminal structure and the second dielectric fin may be disposed about the second side of the terminal structure.

In accordance with still another aspect of this particular exemplary embodiment, the ion implanter may comprise at least one insulated conductors comprising a first dielectric fin, a second dielectric fin, and a third dielectric fin disposed proximate the exterior portion of the terminal structure.

In accordance with further aspects of this particular exemplary embodiment, the first dielectric fin, the second dielectric fin, and the third dielectric fin may be disposed about a side of the terminal structure.

In accordance with additional aspects of this particular exemplary embodiment, at least one of the first dielectric fin, the second dielectric fin, and the third dielectric fin may be made of a different length.

In accordance with another aspect of this particular exemplary embodiment, the at least one dielectric fin may comprise a plurality of dielectric fins distributed about the circumferential surface of the insulated conductor.

In accordance with yet another aspect of this particular exemplary embodiment, the plurality of dielectric fins may be evenly distributed about the circumferential surface of the insulated conductor.

In accordance with still another aspect of this particular exemplary embodiment, the plurality of dielectric fins is unevenly distributed about the circumferential surface of the insulated conductor.

In another particular exemplary embodiment, the terminal structures of an ion implanter may be realized as a method of improving robustness of an ion implanter. The method may comprise generating an ion beam from an ion source at least partially disposed within a cavity defined by a terminal structure and modifying an electric field with an insulated conductor having at least one dielectric fin which may be disposed proximate an exterior portion of the terminal structure.

In accordance with other aspects of this particular exemplary embodiment, modifying the electric field may comprise modifying a tangential electrical field with the insulated conductor having at least one dielectric fin.

In accordance with further aspects of this particular exemplary embodiment, modifying the electric field may further comprise increasing a tracking distance with the insulated conductor having at least one dielectric fin.

In accordance with additional aspects of this particular exemplary embodiment, modifying the electric field with the insulated conductor by disposing a plurality of dielectric fins about a circumferential surface of the insulated conductor.

In another particular exemplary embodiment, the terminal structures of an ion implanter may be realized with insulated conductors with one or more dielectric fins. For example, the ion implanter may comprise a terminal structure having an insulated conductor having at least one dielectric fin disposed proximate an exterior portion of the terminal structure to modify an electric field.

In accordance with other aspects of this particular exemplary embodiment, the ion source may further comprise an ion source configured to provide an ion beam.

In accordance with further aspects of this particular exemplary embodiment, the ion source may furthermore comprise a bracket coupled to the terminal structure and the insulated conductor, the bracket may be configured to support the insulated conductor proximate the exterior portion.

In accordance with additional aspects of this particular exemplary embodiment, the insulated conductor may comprise a grading conductor disposed within an insulator.

In another particular exemplary embodiment, the terminal structures may be realized with insulated conductors having one or more dielectric fins. For example, the terminal structure may comprise an insulated conductor having at least one dielectric fin disposed proximate an exterior portion of the terminal structure to modify an electric field.

The present disclosure will now be described in more detail with reference to exemplary embodiments thereof as shown in the accompanying drawings. While the present disclosure is described below with reference to exemplary embodiments, it should be understood that the present disclosure is not limited thereto. Those of ordinary skill in the art having access to the teachings herein will recognize additional implementations, modifications, and embodiments, as well as other fields of use, which are within the scope of the present disclosure as described herein, and with respect to which the present disclosure may be of significant utility.

BRIEF DESCRIPTION OF THE DRAWINGS

In order to facilitate a better understanding of the present disclosure, reference is now made to the accompanying drawings, in which like elements are referenced with like numerals. These drawings should not be construed as limiting the present disclosure, but are intended to be exemplary only.

DETAILED DESCRIPTION OF EXEMPLARY EMBODIMENTS

Embodiments of the present disclosure overcome inadequacies and shortcomings of existing terminal structures used in ion implanters by providing dielectric fins to modify an electrical field distribution along a tracking path in an ion implanter. It should be noted that, although the description hereinafter refers to a terminal structure for an ion implanter, the terminal structure may be used with other apparatus for modifying an electrical field about a conductive structure. Thus, the present disclosure is not limited to the embodiments described below.

Figure 1:
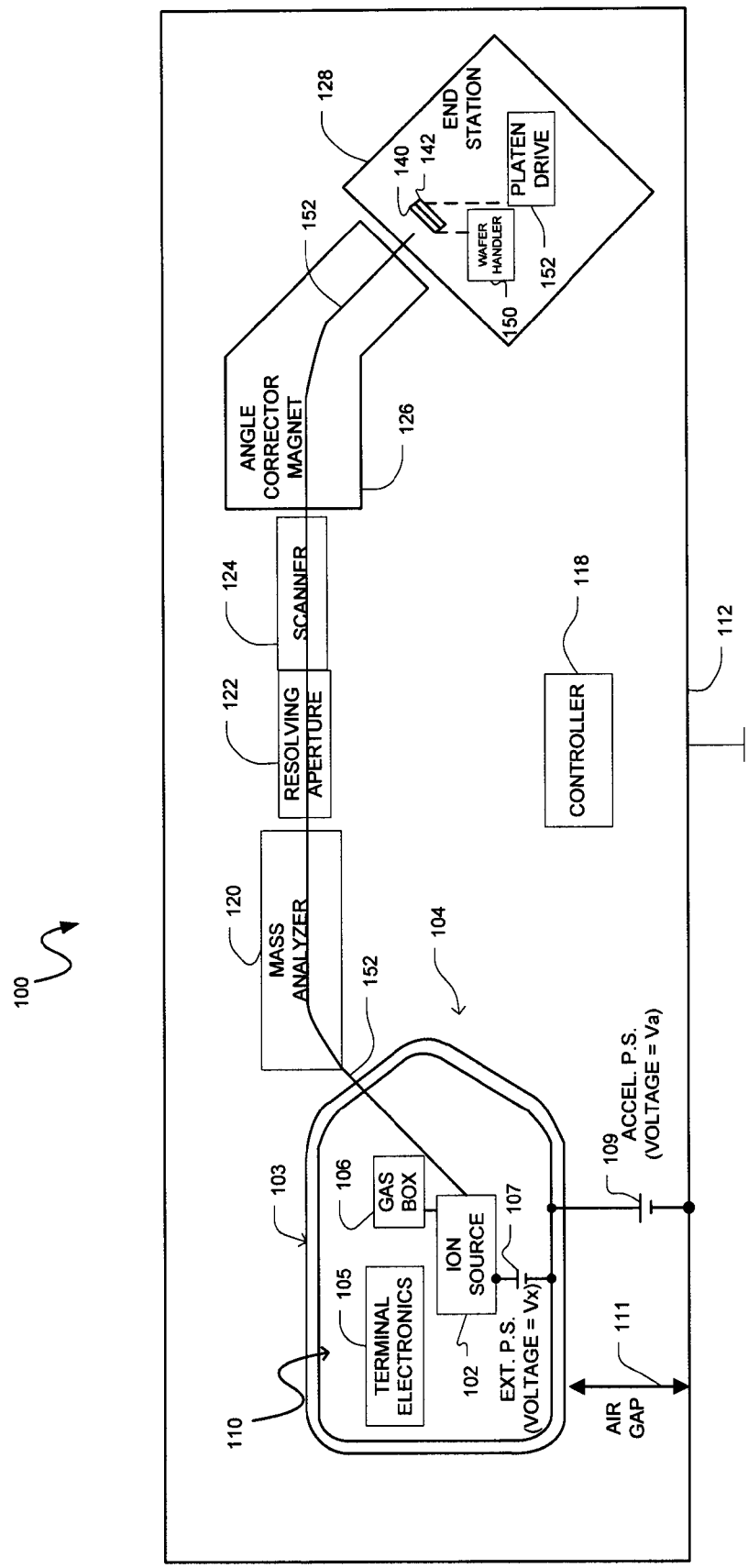
FIG. 1 is a top view of a block diagram of an ion implanter in accordance with an embodiment of the present disclosure.

Referring to FIG. 1, there is shown an exemplary block diagram of an ion implanter 100 in accordance with an embodiment of the present disclosure. The ion implanter 100 may include a terminal structure 104 which may sometimes be referred to as a "terminal" or a "high voltage terminal." The terminal structure 104 may be fabricated of a conductive material such as metal. The ion implanter 100 may also include an insulated conductor 103 disposed proximate an exterior portion of the terminal structure 104 to modify an electric field about the terminal structure 104. The terminal structure 104 and the associated insulated conductor 103 may be utilized in many different ion implanters known to those skilled in the art. Thus, the ion implanter 100 of FIG. 1 is but one embodiment of an ion implanter.

The ion implanter 100 may further include an ion source 102, a gas box 106, a mass analyzer 120, a resolving aperture 122, a scanner 124, an angle corrector magnet 126, an end station 128, and a controller 118. The ion source 102 is configured to provide an ion beam 152. The ion source 102 may generate ions and may include an ion chamber that accepts gas from the gas box 106. The gas box 106 may provide a source of gas to be ionized to the ion chamber. In addition, the gas box 106 may also contain other components such as power supplies. The power supplies may include arc, filament, and bias power supplies for running the ion source 102. The construction and operation of ion sources and gas boxes are well known to those skilled in the art.

The mass analyzer 120 may include a resolving magnet that deflects ions so that ions of a desired species pass through the resolving aperture 122 and undesired species do not pass through the resolving aperture 122. Although showing about a 45 degree deflection for clarity of illustration, the mass analyzer 120 may deflect ions of the desired species by 90 degrees and deflect ions of undesired species by differing amounts due to their different masses and charge states. The scanner 124, positioned downstream from the resolving aperture 122, may include scanning electrodes for scanning the ion beam 152. The angle corrector magnet 126 deflects ions of the desired ion species to convert diverging ion beam paths to nearly collimated ion beam paths having substantial parallel ion trajectories. In one embodiment, the angle corrector magnet 126 may deflect ions of the desired ion species by 45 degrees.

The end station 128 may support one or more work pieces 140 (e.g., wafers and/or other material to be implanted) in the path of the ion beam 152 such that ions of the desired species are implanted into each work piece 140. Each work piece 140 may be supported by a platen 142. The end station 128 may include other components and sub-systems known in the art such as a wafer handling system 150 to physically move the work piece 140 to and from the platen 142 from various holding areas. When the wafer handling system 150 moves the work piece 140 to the platen 142 from a holding area, the work piece 140 may be clamped to the platen 142 using known techniques, e.g., electrostatic wafer clamping where the wafer is clamped to the platen with electrostatic forces. The end station 128 may also include a platen drive system 152 as is known in the art to move the platen 142 in a desired way. The platen drive system 152 may be referred to as a mechanical scan system.

The controller 118 may receive input data from components of the ion implanter 100 and control the same. For clarity of illustration, input/output paths from the controller 118 to components of the ion implanter 100 are not illustrated in FIG. 1. The controller 118 can be or include a general-purpose computer or network of general-purpose computers that may be programmed to perform desired input/output functions. The controller 118 can also include other electronic circuitry or components, such as application specific integrated circuits, other hardwired or programmable electronic devices, discrete element circuits, etc. The controller 118 may also include user interface devices such as touch screens, user pointing devices, displays, printers, etc. to allow a user to input commands and/or data and/or to monitor the ion implantation system 100. The controller 118 may also include communication devices and data storage devices.

The ion beam 152 provided to a surface of the work piece 140 may be a scanned ion beam. Other ion implantation systems may provide a spot beam or a ribbon beam. The spot beam in one instance may have an approximately circular cross-section of a particular diameter depending on the characteristics of the spot beam. The ribbon beam may have a large width/height aspect ratio and may be at least as wide as the work piece 140. The scanner 124 would not be required for systems using a ribbon beam or a stationary spot beam. The ion beam 152 can be any type of charged particle beam, such as an energetic ion beam used to implant the work piece 140. The work piece 140 can take various physical shapes such as a common disk shape. The work piece 140 can be a semiconductor wafer fabricated from any type of semiconductor material such as silicon or any other material that is to be implanted using the ion beam 152.

The ion source 102, the gas box 106, and terminal electronics 105 may be positioned within the cavity 110 defined by the terminal structure 104. The terminal electronics 105 may control operation of the components within the terminal structure 104 and may also be capable of communicating with the controller 118. An extraction power supply 107 may be coupled to the ion source 102. The extraction power supply 107 may provide a voltage level (Vx) to accelerate and extract ions from the ion source 102. In one embodiment, the extraction power supply may provide a voltage (Vx) in the range of 20 kV to 120 kV.

An additional acceleration power supply 109 may be coupled between the terminal structure 104 and the grounded enclosure 112 so as to bias the terminal structure 104 at a positive voltage (Va) with respect to ground. In one embodiment, the acceleration power supply 109 may provide an additional voltage level (Va) that may have a maximum voltage in the range of 200 kV to 1,000 kV, and may be at least 400 kV in one embodiment. Accordingly, the terminal structure 104 may be energized, in some instances, to a high voltage between 200 kV and 1,000 kV. In other instances, the terminal structure 104 may not be energized at all or energized to nominal values only depending on a desired energy of the ion beam 152. Although only one acceleration power supply 109 is illustrated for clarity of illustration, two or more power supplies may be utilized to provide the desired maximum high voltage level (Va).

During operation of the ion implanter 100, the terminal structure 104 may be energized, in some instances, to at least 400 kV, e.g., 670 kV in one embodiment. The insulated conductor 103 is disposed proximate an exterior portion of the terminal structure 104 to modify an electric field about the terminal structure 104. The insulated conductor 103 includes an insulator with a dielectric strength greater than 75 kilovolts (kV)/inch disposed about a conductor. The electric stress on the surface of the conductor may be high due to the high voltage and a small radius for the conductor. Therefore, an insulator having an optimized thickness may be disposed about the conductor to reduce the electrical stress. The insulated conductor 103 may be made from a single continuous insulating material disposed about a conductor or segmented sections of insulating material disposed about a conductor. Also, the voltage will be lowered once the electric field lines exit the insulator of the insulated conductor 103. Hence, the insulated conductor 103 reduces the electric stress in an air gap 111, between the terminal structure 104 and the grounded enclosure 112 and helps to promote a more uniform electric field within the air gap 111 compared to terminal structures with no such insulated conductors. In other words, the insulated conductor 103 may function as an electrical stress shield. Therefore, the terminal structure 104 may be energized to higher voltage levels, e.g., at least 600 kV as opposed to 200 kV, within the same reasonably sized grounded enclosure 112. Alternatively, for operation at the same lower terminal voltage of about 200 kV and less, the insulated conductor 103 can enable the air gap 111 to be reduced compared to air only insulation schemes.

Figure 2:
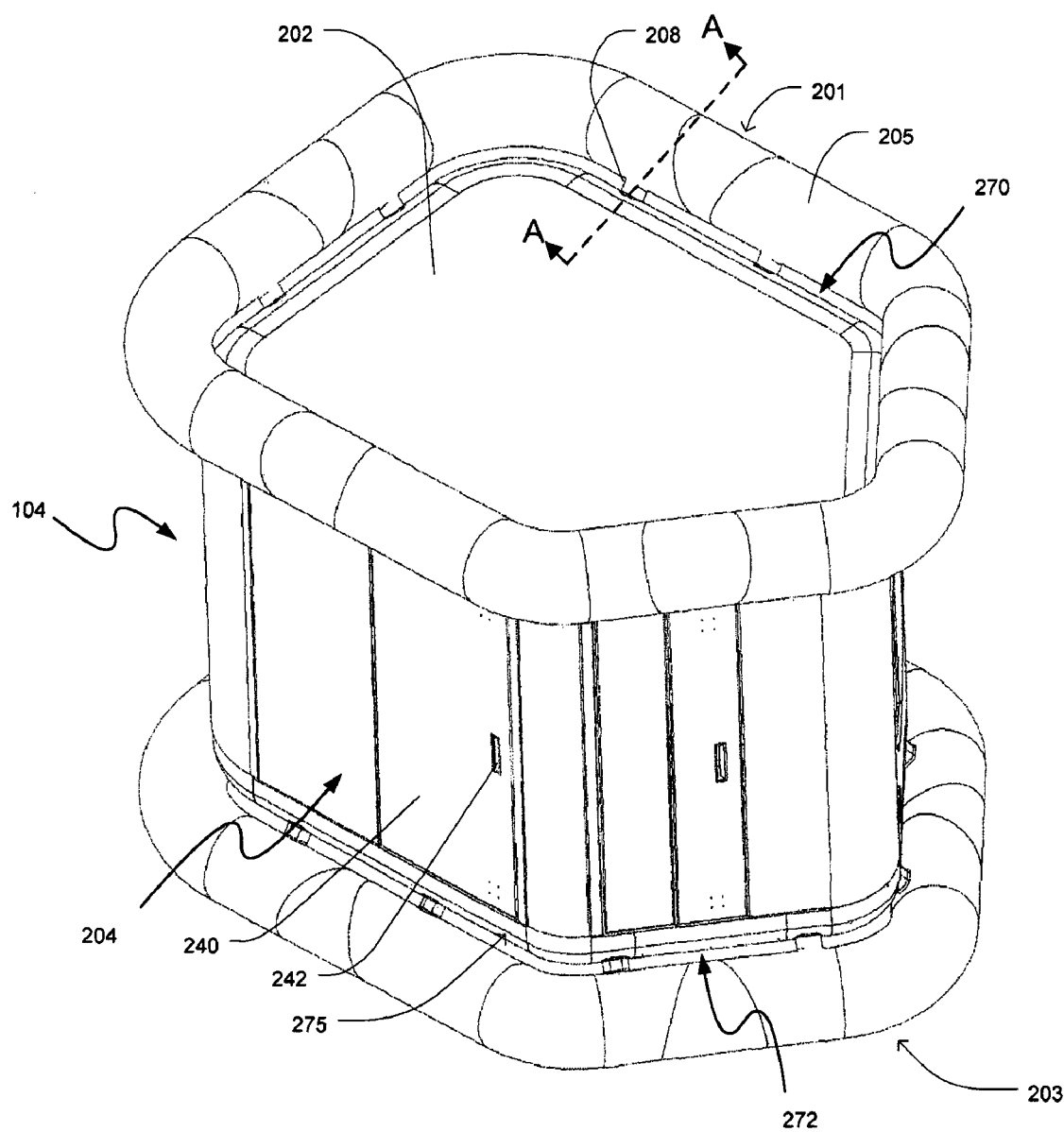
FIG. 2 is a perspective view of the terminal structure of the ion implanter of FIG. 1 in accordance with an embodiment of the present disclosure.

Referring to FIG. 2, there is shown an exemplary perspective view of the terminal structure 104 in accordance with an embodiment of the present disclosure. The terminal structure 104 may include a base 275, one or more upstanding sidewalls 204 coupled to the base 275, and a top 202 coupled to the one or more upstanding sidewalls 204. One upstanding sidewall 204 may have a door 240 with a handle 242 to provide personnel access to the internal cavity of the terminal structure 104. The terminal structure 104 may have one upstanding sidewall 204 manufactured of one solid material piece or any plurality of separate pieces. Although illustrated as a solid piece, the top 202 of the terminal structure 104 may also be fabricated of a plurality of spaced conductors forming a type of conductor mesh to allow air to flow through the openings of the mesh.

In general, one or more insulated conductors may be disposed about portions of the exterior surface of the terminal structure 104 that have excess electric stress. As shown in FIG. 2, a top insulated conductor 201 is disposed proximate the entire periphery of a top edge 270 of the terminal structure 104, and a bottom insulated conductor 203 is disposed proximate the entire periphery of a bottom edge 272 of the terminal structure 104. Although the top and bottom insulated conductors 201 and 203 are positioned about an entirety of the periphery of the respective edges 270, 272, alternative embodiments may have additional or alternative exterior portions where insulated conductors may be positioned. These portions may include, but are not limited to, horizontal edges, vertical edges, corners, and openings or interfaces where the terminal structure 104 interfaces with external parts. Some external parts may include a generator, or a utility interface. In one example, a sphere shaped insulated conductor may be positioned about a corner of the terminal structure 104.

A plurality of brackets 208 may be coupled to the terminal structure 104 and the associated insulated conductors 201 and 203 to support the insulated conductors 201 and 203 proximate an exterior portion of the terminal structure 104. The number and position of the brackets depends on the characteristics of the insulated conductors 201 and 203, the geometry of the terminal structure 104, and the type of bracket. The brackets may have a length to enable the insulated conductors 201 and 203 to be positioned a desired distance from an exterior portion of the terminal structure 104. The desired distance may range from almost zero (nearly touching) to a maximum distance permitted by a surrounding air gap. In one embodiment, the desired distance is at least 1.5 inches. The brackets, e.g., bracket 208, may be fabricated of either conductive or nonconductive material or a composite including conductive and nonconductive material.

Figure 3:
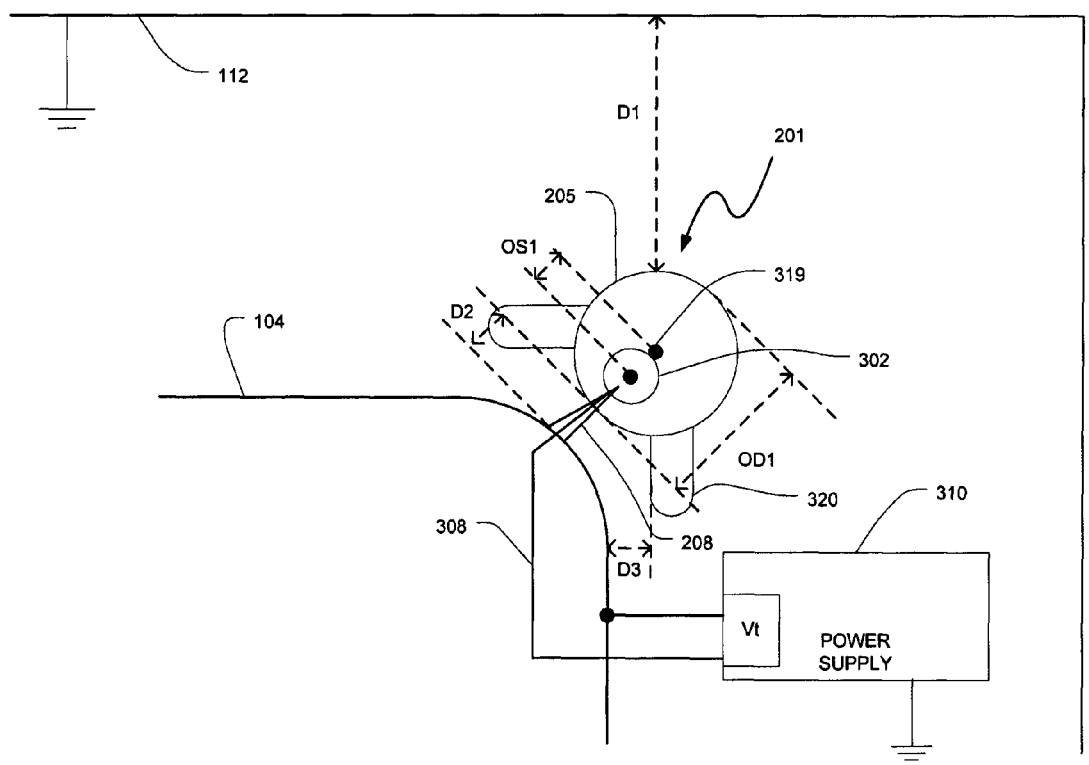
FIG. 3 is a cross-sectional view of one embodiment of the insulated conductor taken along the line A-A of FIG. 2 in accordance with an embodiment of the present disclosure.

Referring to FIG. 3, there is shown an exemplary cross-sectional view of one embodiment of the insulated conductor 201 taken along the line A-A of FIG. 2 in accordance with an embodiment of the present disclosure. The insulated conductor 201 includes an insulator 205 with a dielectric strength greater than 75 kV/inch disposed about a conductor 302. In one embodiment, the insulator 205 may be a solid insulator. The solid insulator may include, but not be limited to, syntactic foam, chlorinated polyvinyl chloride (CPVC), polyvinylidene difluoride (PVDF), ethylene chlorotrifluoroethylene (ECTFE), polytetrafluoroethylene (PTFE), or a polyimide (e.g., kapton). The syntactic foam may include hollow glass spheres and/or polymer pellets dispersed about a filling compound such as epoxy resin or silicone. In one embodiment, a syntactic foam insulator may have an average dielectric strength of about 300 kV/inch on test samples about 0.25 inches thick. In other embodiments, solid insulators may have a dielectric strength greater than 150 kV/inch. Alternatively, the insulator 205 may have a chamber wall that defines an internal cavity and the internal cavity may be filled with a liquid insulator or a gas insulator. The liquid insulator may include, but is not limited to, oil. The gas insulator may include, but is not limited to, carbon dioxide ($CO_2$), sulphur hexafluoride ($SF_6$), or pressurized air. Some gases may not need to be pressurized depending on their non pressurized dielectric strength. Vacuum insulation and/or any combination to form a composite insulation may also be utilized. The conductor 302 may be a high voltage conductor having a hollow cross-section or a solid cross-section. The insulated conductor 201 may be fabricated as a single entity or composed and joined from segments of insulated conductors.

A power supply 310 may energize the terminal structure 104 and the conductor 302. In one embodiment, the power supply 310 is configured to energize the conductor 302 to a first voltage and the terminal structure 104 to the same first voltage, e.g., a terminal voltage (Vt). This terminal voltage may be at least 400 kV in one embodiment. This terminal voltage may also be a DC voltage in one instance. If the bracket 208 is fabricated of a conductive material, the power supply 310 may provide the voltage to the terminal structure 104 which may also be provided to the conductor 302 via the conductive bracket 208. If the bracket 208 is fabricated of a nonconductive material, a separate conductor 308 may electrically couple the power supply 310 to the conductor 302. The conductor 308 may be fed through an opening in the bracket 208. Having a separate conductor 308 also enables the conductor 302 to be energized to a different voltage level than the terminal voltage (Vt).

Non-pressurized air may be present within the grounded enclosure 112 about the terminal structure 104 and insulated conductor 201. Non-pressurized air may have a dielectric strength of less than or equal to about 75 kV/inch under assumed conditions. This dielectric strength may change with relative humidity, altitude above sea level of the particular location of the ion implanter (i.e., air pressure), separation distance, and electrode surface finish. Temperature also impacts the breakdown strength of air. Essentially the temperature and pressure ($PV=nRT$) changes show that what is actually changing is the air density. Air density impacts breakdown strength through pressure and temperature.

As a safety measure to account for such variations, a dielectric strength of less than or equal to about 45 kV/inch for air may be utilized as a design rule in one instance. In any event, it would be desirable to have the electric field stress at the exterior of the insulated conductor 201 reduced to a value consistent with the selected design rule for air, even if the terminal structure 104 is energized to 600 to 1,000 kV. In this way, the remaining air gap between the insulated conductor 201 and the grounded enclosure 112 (e.g., distance D1) would be adequate to insulate the terminal structure 104 without electrical breakdown, e.g., arcing.

The geometry of the insulated conductor 201 may therefore be selected so the electric field stress at the exterior surface of the insulated conductor 201 is less than the selected design rule for air. In some embodiments, the outside diameter (OD1) of the insulator 205 may range between 8 inches and 16 inches depending on the dielectric strength of the particular insulator selected and design rules being used for air at the surface of the insulator 205. The conductor 302 may have a center that is offset from the center 319 of the insulator 205 by an offset distance (OS1) ranging from 0 to about 3.0 inches depending on the available space within the insulator 205 and the diameter of the conductor 302. In one particular embodiment, the insulator 205 is syntactic foam having an outside diameter (OD1) of 11 inches, the conductor 302 has a diameter of 4 inches spaced an offset distance (OS1) of 3.0 inches from the center of the insulator 205, and the bracket 208 has a length to enable the insulated conductor 201 to be positioned a distance (D2) of approximately 1.5 inches from the terminal structure 104.

Moreover, the insulated conductor 201 may exhibit an electrostatic force when connected to the power supply 310 and therefore may attract metallic and non-metallic particles. Also, insulating material 205 covering the conductor 302 may exhibit a static characteristic and thus may attract metallic and non-metallic particles. The presence of metallic and non-metallic particles on the surface of the insulated conductor 201 may compromise the high voltage performance of the terminal structure 104 insulation.

The metallic and non-metallic particles may exist in the air gap 111 between the terminal structure 104 and the grounded enclosure 112. The metallic and non-metallic particles may be attracted onto the surface of the insulated conductor 201 and may initiate breakdown of surrounding air. The breakdown of surrounding air may be caused by the electric field stress on the surface of the insulated conductor 201. The electric field stress on the surface of the insulated conductor 201 may include a tangential electric field stress and a normal electric field stress. The metallic and non-metallic particles located on the surface of the insulated conductor 201 may create a large amount of electric field stress and cause air around the particles to breakdown and form a corona discharge. Charged particles formed by the corona may be driven by the tangential electric field along the surface of the insulated conductor 201 and form a flashover or an arc. By eliminating or reducing the tangential electric field stress on the surface of the insulated conductor 201, the flashover or the arc may be reduced. By providing dielectric fins 320 on the surface of the insulated conductor 201, thereby making the insulated conductor 201 more resistant to particles (i.e., localized electric field stress) over the surface of the insulated conductor 201 by interrupting the continuous flow of the tangential electric field.

A single or plurality of dielectric fins 320 may be located at various positions on the outer periphery surface of the insulated conductor 201 to interrupt the tangential electric field stress and providing regions of zero tangential electric field stress therefore making the insulated conductor 201 more robust against the accumulation of metallic and non-metallic particles. Also, the dielectric fins 320 may modify the electric field stress distribution along the tracking path and extend the surface tracking length. As shown in FIG. 3, two dielectric fins 320 may extend parallel to the top, the base or the sidewalls of the terminal structure 104. The dimension of the dielectric fins 320 may be designed to sufficiently interrupt the tangential electric field on the surface of the insulated conductor 201. For example, the dielectric fins 320 may be approximately 4 inches long and 2 inches wide. Also, the dielectric fins 320 may be positioned at a distance (D3) from the terminal structure 201. For example, the dielectric fins 320 may be positioned approximately 4.3 inches from the terminal structure 104. Further, a connecting portion of the dielectric fins 320 and the insulated conductor 201 may be curved or have a smooth surface in order to reduce electric field stress. The dielectric fins 320 interrupt the tangential electric field and therefore provide a discontinuous path of surface discharge and reduce the sensitivity of the insulated conductor 201 to the presence of undesired particles.

Figure 4:
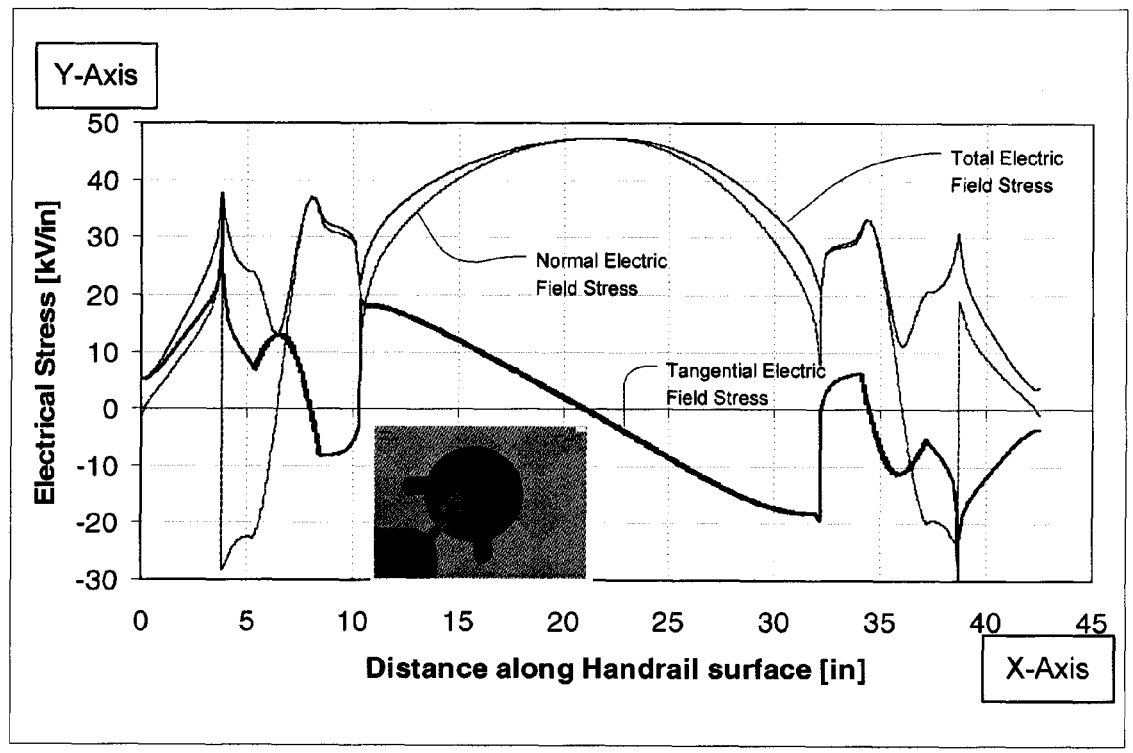
FIG. 4 is a plot of electrical field stress in accordance with the embodiment shown in FIG. 3 of the present disclosure.

Referring to FIG. 4, there is shown an exemplary plot of electric field stress along a surface of the insulated conductor 201 shown in FIG. 3 in accordance with an embodiment of the present disclosure. FIG. 4, illustrates a plot of the tangential electrical field stress, the normal electrical field stress, and the total electrical field stress along a circumferential distance of the surface of the insulated conductor 201. The electric field stress on the surface of the insulated conductor 201 may be measured in kilovolts per inch (KV/in) as shown on the Y-axis. The circumferential distance of the insulated conductor 201 from the connection to the terminal structure 104 along the peripheral surface and back may be indicated on the X-axis. For example, a first dielectric fin 320 may be located approximately at an 8 inch mark of the circumferential distance along the surface of the insulated conductor 201. Therefore, as shown in FIG. 4, the tangential electric field stress on the surface of the insulated conductor 201 at the location of the first dielectric fin 320 is below zero. Also, a second dielectric fin 320 may be located approximately at a 32 inch mark of the circumferential distance along the surface of the insulated conductor 201. The tangential electric field stress on the surface of the insulated conductor 201 at the location of the second dielectric fin 320 also is below zero.

Figure 5:
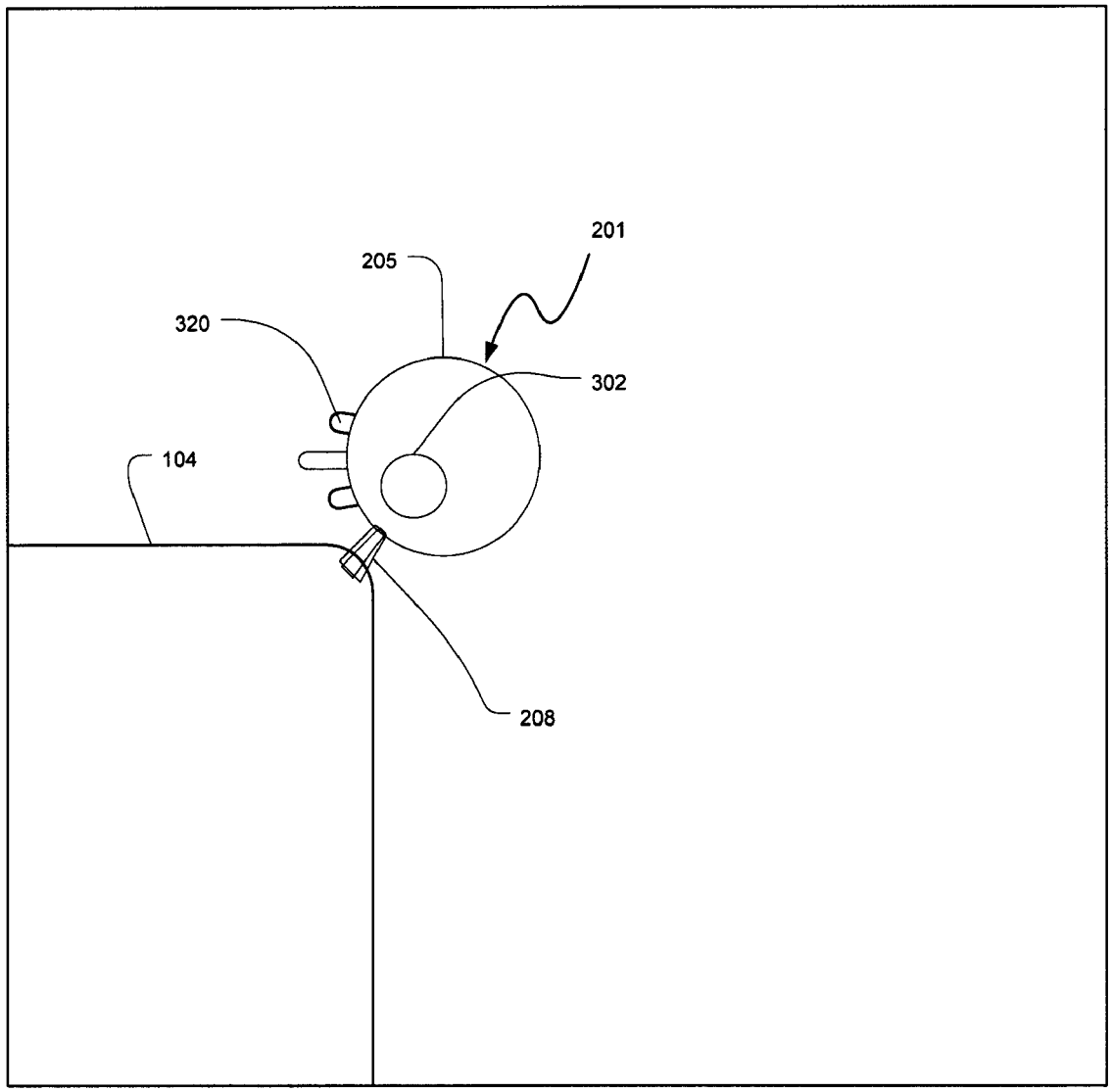
FIG. 5 is a cross-sectional view of another embodiment of the insulated conductor taken along the line A-A of FIG. 2 in accordance with an embodiment of the present disclosure.

Referring to FIG. 5, there is shown an exemplary cross-sectional view of another embodiment of the insulated conductor 201 taken along the line A-A of FIG. 2 in accordance with an embodiment of the present disclosure. Three dielectric fins 320 made of different dimensions may be positioned parallel to the top, the base or the sidewalls of the terminal structure 104. Also, the plurality of dielectric fins 320 may be positioned parallel to the plurality of sidewalls 204 of the terminal structure 104. According to different embodiments, the dielectric fins 320 may be positioned in a cluster next to each other or spaced far apart from each other. As shown in FIG. 5, the length of the dielectric fins 320 may be varied. For example, the middle dielectric fin 320 may be approximately twice as long as the dielectric fins 320 located on each side thereof. Furthermore, the width of the dielectric fins 320 may be varied according to different embodiments.

Figure 6:
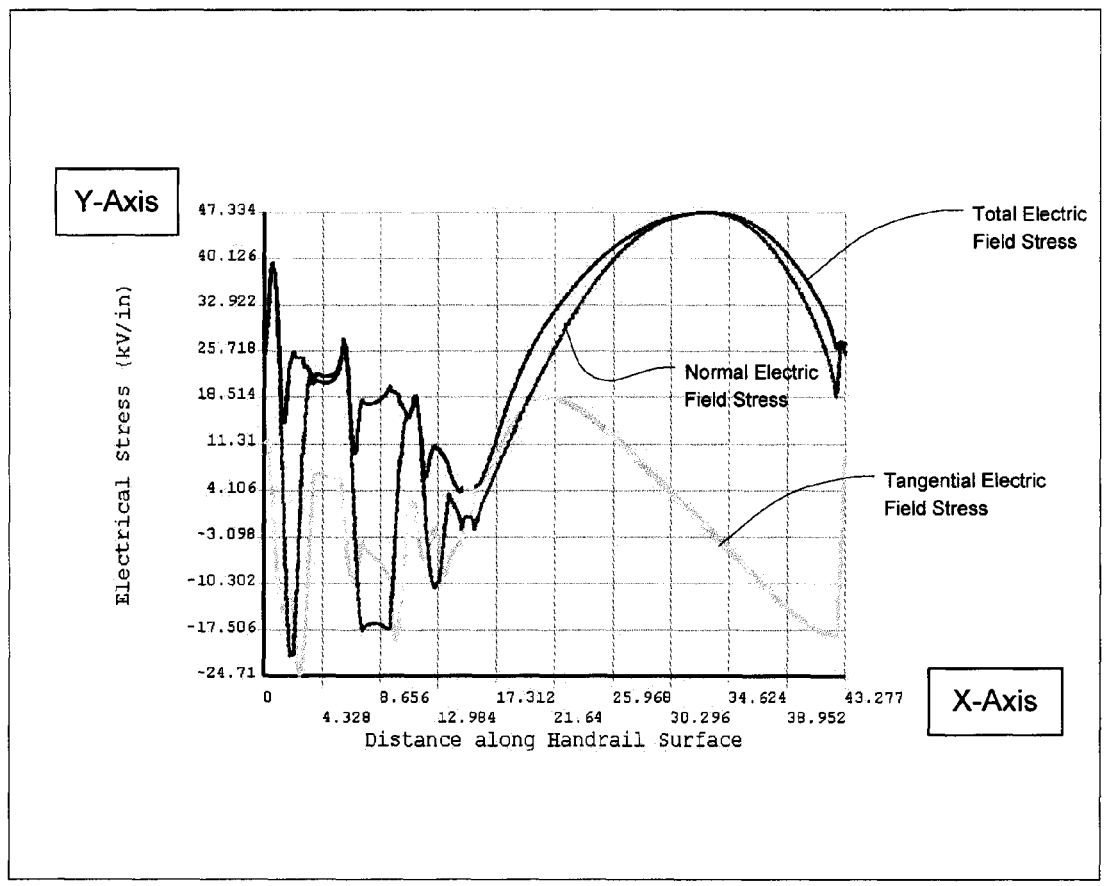
FIG. 6 is a plot of electrical field stress in accordance with the embodiment shown in FIG. 5 of the present disclosure.

Referring to FIG. 6, there is shown an exemplary plot of electric field stress along the surface of the insulated conductor 201 shown in FIG. 5 in accordance with an embodiment of the present disclosure. FIG. 6 illustrates a plot of the tangential electrical field stress, the normal electrical field stress, and the total electrical field stress along a circumferential distance of the surface of the insulated conductor 201. The electric field stress on the surface of the insulated conductor 201 may be measured in kilovolts per inch (KV/in) as shown on the Y-axis. The circumferential distance of the insulated conductor 201 from a connection to the terminal structure 104 along the peripheral surface and back may be indicated on the X-axis. As shown in FIG. 6, the tangential electric field stress is below zero at plurality of locations along the circumferential distance of the surface of the insulated conductor 201. The plurality of locations along the surface of the insulated conductor 201 where the tangential stress is below zero indicates the location of three dielectric fins 320 shown in FIG. 5.

Figure 7:
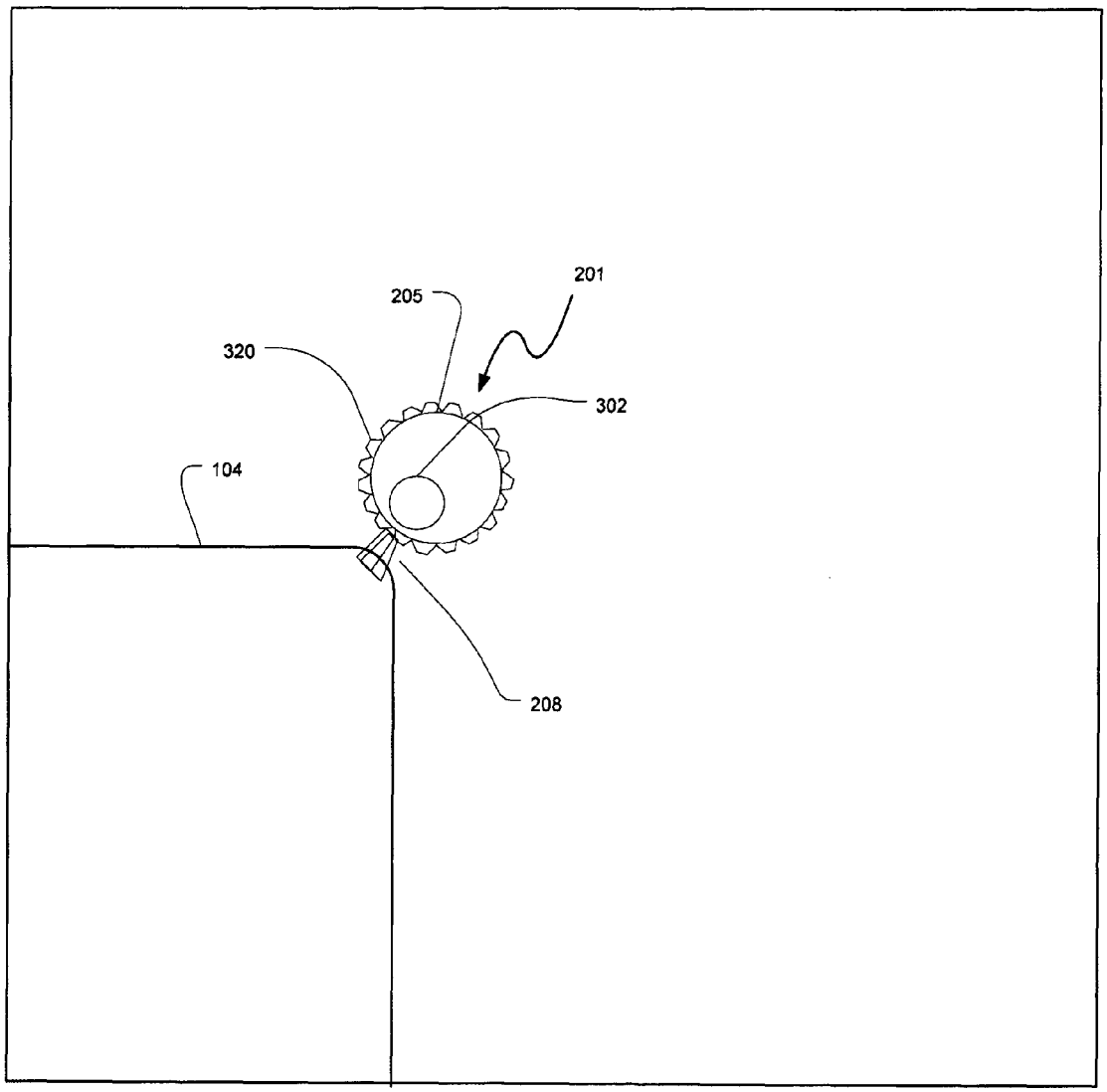
FIG. 7 is a cross-sectional view of another embodiment of the insulated conductor take along the line A-A of FIG. 2 in accordance with an embodiment of the present disclosure.

Referring to FIG. 7, there is shown an exemplary cross-sectional view of another embodiment of the insulated conductor 201 taken along the line A-A of FIG. 2 in accordance with an embodiment of the present disclosure. Plurality of dielectric fins 320 may be evenly spaced around the peripheral surface of the insulated conductor 201. Also, the plurality of dielectric fins 320 may be unevenly spaced around the peripheral surface of the insulated conductor 201. According to different embodiments, the size of the dielectric fins 320 may be varied around the circumferential distance along the insulated conductor 201. Further, the width of the dielectric fins 320 may be varied around the circumferential distance along the insulated conductor 201.

Figure 8:
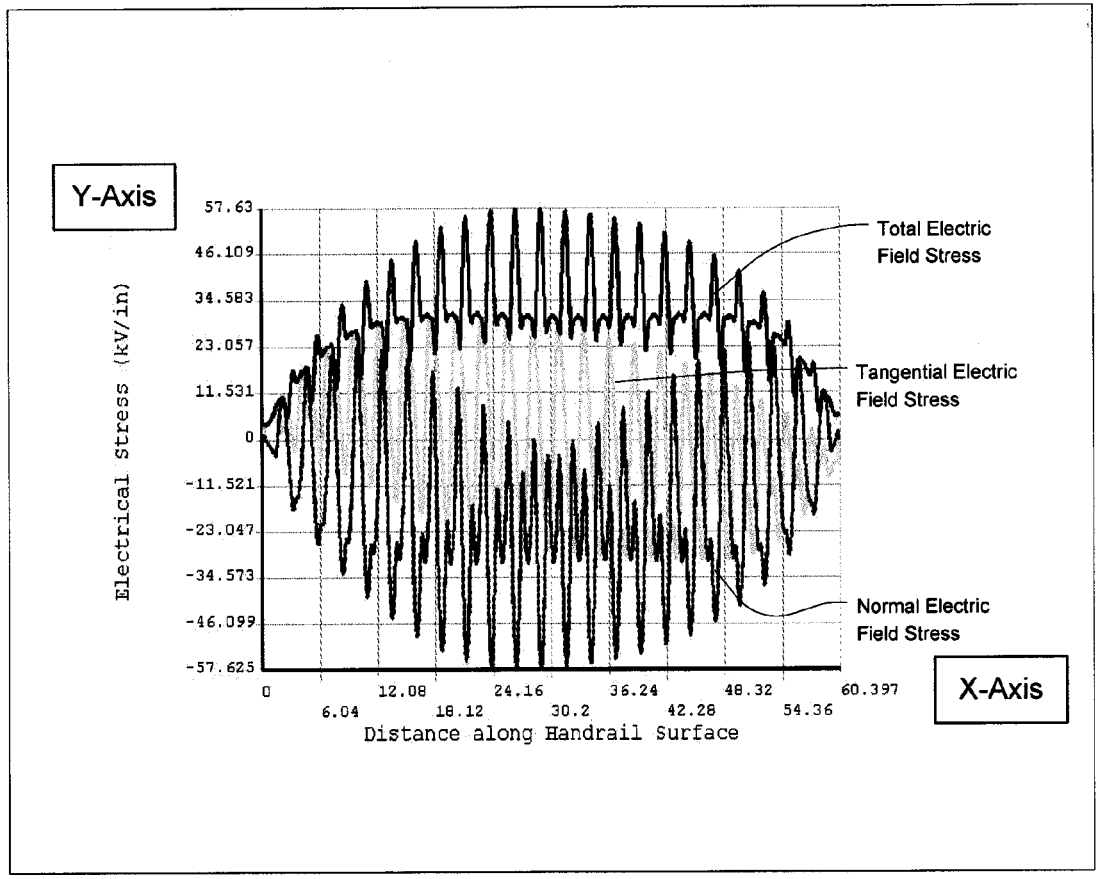
FIG. 8 is a plot of electrical field stress in accordance with the embodiment shown in FIG. 7 of the present disclosure.

Referring to FIG. 8, there is shown an exemplary plot of electrical stress along the surface of the insulated conductor 103 shown in FIG. 7 in accordance with an embodiment of the present disclosure. FIG. 8 illustrates a plot of the tangential electrical field stress, the normal electrical field stress, and the total electrical field stress along the circumferential distance of the surface of the insulated conductor 201. The electric field stress on the surface of the insulated conductor 201 may be measured in kilovolts per inch (KV/in) as shown on the Y-axis. The circumferential distance of the insulated conductor 201 from the connection to the terminal structure 104 along the peripheral surface and back may be indicated on the X-axis. As shown in FIG. 8, the tangential electric field stress is below zero at plurality of locations of the circumferential distance along the insulated conductor 201. The plurality of locations where the tangential stress is below zero indicates the location of the plurality of dielectric fins 320 shown in FIG. 7.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

The invention claim is:

1. An ion implanter, comprising:
an ion source configured to provide an ion beam;
a terminal structure defining a cavity, the ion source at least partially disposed within the cavity;
an insulated conductor having at least one dielectric fin disposed proximate an exterior portion of the terminal structure to modify an electric field, wherein the insulated conductor comprises a conductor disposed within an insulator.

2. The ion implanter according to claim 1, wherein the insulated conductor is configured to be energized to a first voltage and the terminal structure is configured to be energized to the first voltage.

3. The ion implanter according to claim 2, wherein the first voltage is at least 400 kV.

4. The ion implanter according to claim 1, further comprising a bracket coupled to the terminal structure and the insulated conductor, the bracket configured to support the insulated conductor proximate the exterior portion.

5. The ion implanter according to claim 1, wherein the exterior portion of the terminal structure comprises a periphery of a top edge of the terminal structure and a periphery of a bottom edge of the terminal structure, and wherein the insulated conductor comprises a top insulated conductor disposed about the periphery of the top edge and a bottom insulated conductor disposed about the periphery of the bottom edge.

6. The ion implanter according to claim 1, wherein the insulator comprises a tubular member defining an interior portion, the conductor disposed within the interior portion.

7. The ion implanter according to claim 1, wherein the insulator comprises chlorinated polyvinyl chloride (CPVC), polyvinylidene difluoride (PVDF), ethylene chlorotrifluoroethylene (ECTFE), polytetrafluoroethylene (PTFE), polyimide or a silicone syntactic foam.

8. The ion implanter according to claim 1, wherein the at least one dielectric fin comprises a first dielectric fin and a second dielectric fin disposed proximate the exterior portion of the terminal structure.

9. The ion implanter according to claim 8, wherein the exterior portion of the terminal structure comprises a first side of the terminal structure and a second side of the terminal structure, and wherein the first dielectric fin is disposed about the first side of the terminal structure and the second dielectric fin is disposed about the second side of the terminal structure.

10. The ion implanter according to claim 1, wherein the at least one dielectric fin comprises a first dielectric fin, a second dielectric fin, and a third dielectric fin disposed proximate the exterior portion of the terminal structure.

11. The ion implanter according to claim 10, wherein the first dielectric fin, the second dielectric fin, and the third dielectric fin are disposed about a side of the terminal structure.

12. The ion implanter according to claim 10, wherein at least one of the first dielectric fin, the second dielectric fin, and the third dielectric fin is made of a different length.

13. The ion implanter according to claim 1, wherein the at least one dielectric fin comprises a plurality of dielectric fins distributed about the circumferential surface of the insulated conductor.

14. The ion implanter according to claim 13, wherein the plurality of dielectric fins is evenly distributed about the circumferential surface of the insulated conductor.

15. The ion implanter according to claim 13, wherein the plurality of dielectric fins is unevenly distributed about the circumferential surface of the insulated conductor.

16. A method of improving robustness of an ion implanter, comprising:
generating an ion beam from an ion source;
modifying an electric field with an insulated conductor having at least one dielectric fin disposed proximate an exterior portion of the terminal structure.

17. The method according to claim 16, wherein modifying the electric field comprises modifying a tangential electrical field with the insulated conductor having at least one dielectric fin.

18. The method according to claim 16, wherein modifying the electric field further comprises increasing a tracking distance with the insulated conductor having at least one dielectric fin.

19. The method according to claim 16, wherein modifying the electric field with the insulated conductor by disposing a plurality of dielectric fins about a circumferential surface of the insulated conductor.

20. An ion implanter, comprising:
a terminal structure having an insulated conductor, the insulated conductor having at least one dielectric fin disposed proximate an exterior portion of the terminal structure to modify an electric field, wherein the insulated conductor comprises a conductor disposed within an insulator.

21. The ion implanter according to claim 20, further comprises an ion source configured to provide an ion beam.

22. The ion implanter according to claim 20, further comprising a bracket coupled to the terminal structure and the insulated conductor, the bracket configured to support the insulated conductor proximate the exterior portion.

* * * * *